United States Patent
Kim et al.

(10) Patent No.: US 9,105,844 B2
(45) Date of Patent: Aug. 11, 2015

(54) PIEZOELECTRIC DEVICE WITH PIEZOELECTRIC POLYMER MATERIAL

(71) Applicant: Samsung Electro-Mechanics Co., Ltd., Suwon-si, Gyunggi-do (KR)

(72) Inventors: Woon Chun Kim, Suwon-si (KR); Kwang Joe Jeon, Jr., Seongnam-si (KR); Seung Hyun Sohn, Suwon-si (KR); Kang Heon Hur, Seongnam-si (KR); Hyun Ho Lim, Suwon-si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 283 days.

(21) Appl. No.: 13/683,606

(22) Filed: Nov. 21, 2012

(65) Prior Publication Data
US 2013/0127299 A1    May 23, 2013

(30) Foreign Application Priority Data
Nov. 22, 2011 (KR) .......................... 10-2011-0122341

(51) Int. Cl.
*H01L 41/08* (2006.01)
*H01L 41/18* (2006.01)
*H01L 41/047* (2006.01)
*H01L 41/193* (2006.01)
*B82Y 15/00* (2011.01)
*B82Y 30/00* (2011.01)

(52) U.S. Cl.
CPC .............. *H01L 41/18* (2013.01); *H01L 41/047* (2013.01); *H01L 41/0477* (2013.01); *H01L 41/0478* (2013.01); *H01L 41/193* (2013.01); *B82Y 15/00* (2013.01); *B82Y 30/00* (2013.01)

(58) Field of Classification Search
CPC ....................................................... H01L 41/193
USPC .................................................. 310/328, 800
See application file for complete search history.

(56) References Cited

U.S. PATENT DOCUMENTS 7,315,106 B2 * 1/2008 Asaka et al. ................... 310/300
2013/0307370 A1 * 11/2013 Jenninger et al. ............. 310/300

FOREIGN PATENT DOCUMENTS

KR        10-0972637 B1        7/2010

OTHER PUBLICATIONS

Shin et al., "Flexible and transparent graphene films as acoustic actuator electrodes using inkjet printing", Chemical Communications Issue 30, 2011, The Royal Society of Chemistry 2011.

* cited by examiner

*Primary Examiner* — Jaydi San Martin
(74) *Attorney, Agent, or Firm* — McDermott Will & Emery LLP

(57) ABSTRACT

The present invention relates to a piezoelectric device of a multi-layered structure on which first electrodes and second electrodes are sequentially stacked on a piezoelectric polymer and single surfaces or both surfaces of piezoelectric polymer.

In accordance with the present invention, the vibration response characteristics of the piezoelectric polymer can be improved by using the graphene or the composite thereof as a surface electrode material to the piezoelectric polymer; and, there are effects that the response characteristics of the piezoelectric device are excellent and the reliability thereof is excellent by forming a second electrode having an excellent conductivity and a protection electrode thereof.

9 Claims, 1 Drawing Sheet

100

200

PIEZOELECTRIC DEVICE WITH PIEZOELECTRIC POLYMER MATERIAL

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2011-0122341, entitled filed Nov. 22, 2011, which is hereby incorporated by reference in its entirety into this application.

BACKGROUND OF THE INVENTION

1. Field of the Invention

The present invention relates to a piezoelectric device of polymer.

2. Description of the Related Art

Although a piezoelectric or a pyroelectric polymer material is very flexible and light and the commercialization thereof has been widely applied to a flat speaker, various switches, medical sensors, aerospace and aviation materials due to its wide vibration range, but it has various limitations in usages due to its low dielectric constant and low electromechanical coupling coefficient.

In commercializing the piezoelectric polymer material, it is very important to form a metal electrode on a piezoelectric polymer substrate, and a quality of the piezoelectric film is greatly affected by a method used for forming the film.

As such piezoelectric polymer materials are provided with intrinsic characteristics of the polymer materials such as flexibility, shock resistance, fabrication easiness, a large-area possibility or the like, they have high power output constant (piezoelectric g constant) in comparison with an inorganic piezoelectric material; and also, since an acoustic impedance is similar to human bodies or water, they are expected to be applied to various sensors or ultrasonic transducers such as hydro phone or vibration damper (damper) or vibration generation.

Although the piezoelectric polymer having a piezoelectricity in itself of the polymer represented as the polyvinylidene fluoride (PVDF) is well known, since it has a low d constant in comparison with an inorganic piezoelectric material, the sufficient performance cannot be obtained in case of being used for the above usage.

SUMMARY OF THE INVENTION

The present invention has been invented in order to overcome the above-described problems and it is, therefore, an object of the present invention to provide a piezoelectric device of a structure capable of an overall response characteristic of the piezoelectric device in the piezoelectric device using the piezoelectric polymer material.

In accordance with an embodiment of the present invention to achieve the object, there is provided a piezoelectric device with a multi-layered structure, including: a piezoelectric polymer; and a plurality of first electrodes and a plurality of second electrodes stacked sequentially a single surface or both surface of the piezoelectric polymer.

The piezoelectric polymer may be polyvinylidene fluoride (PVDF) and polyvinylidene florodide-trifluoroethylene (PVDF-TrFE).

The first electrodes may preferably use graphene or a graphene composite including the same.

In accordance with one embodiment of the present invention, the graphene composite is made of a material obtained by mixing the graphene with at least one type material selected from a group consisting of a metal nano wire, a metal nano particle, a carbon nano tube and conductive polymer.

In accordance with one embodiment of the present invention, the second electrodes may be transparent electrodes or opaque electrodes.

Preferably, the transparent electrode is a grid electrode.

The opaque electrodes may be obtained by coating metal on a whole surface.

The metal may be at least one powder, a nano wire or a nano particle selected from a group consisting of Au, Cu, Al and Ag.

The piezoelectric device can further include a plurality of third electrodes on the second electrodes.

The third electrodes may preferably use graphene or graphene composites including the same.

In accordance with one embodiment of the present invention, the graphene composites may be made of materials obtained by mixing the graphene with at least one type material selected from a group consisting of a metal nano wire, a metal nano particle, a carbon nano tube and conductive polymer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Hereinafter, the present invention will be described in detail.

Terms used herein are provided to explain embodiments, not limiting the present invention. Throughout this specification, the singular form includes the plural form unless the context clearly indicates otherwise. Further, terms "comprises" and/or "comprising" used herein specify the existence of described shapes, numbers, steps, operations, members, elements, and/or groups thereof, but do not preclude the existence or addition of one or more other shapes, numbers, operations, members, elements, and/or groups thereof.

Figure 1:
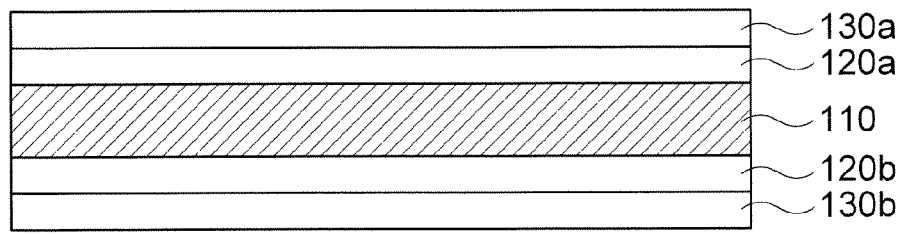
FIGS. 1 and 2 are diagrams showing a structure of a piezoelectric device of polymer in accordance with an embodiment of the present invention.

The piezoelectric polymer device 100 of polymer in accordance with the present invention is shown in FIG. 1, a piezoelectric polymer 110 is arranged in a central portion, and has a multi-layered structure in which first electrodes 120a and 120b and second electrodes 130a and 130b are sequentially stacked on a single surface or both surfaces of the piezoelectric polymer 110.

The piezoelectric polymer 110 in accordance with the present invention may be polyvinylidene fluoride (PVDF) and polyvinylidene florodide-trifluoroethylene (PVDF-TrFE), wherein the polyvinylidene florodide-trifluoroethylene (PVDF-TrFE) is further preferable among those since it has a piezoelectric constant greater than that of the PVDF and a thickness and a size control of film are easy because a solution casting is available.

After the piezoelectric polymer 110 can be formed in a shape of film by solving the polyvinylidene florodide-trifluoroethylene (PVDF-TrFE) in a solvent including at least one organic material such as methyl ethyl ketone (MEK), coating in a method such as a casting and evaporating the solvent.

And also, the first electrodes 120a and 120b can be made of by preferably using the graphene as a surface electrode material or the graphene composite including the same. It is preferable that the graphene used in the present invention has a graphene sheet shape in which carbons are connected in a hexagonal sheet structure.

In the present invention, the vibration response characteristics of the piezoelectric polymer can be improved since the graphene having the sheet structure different from the other transparent electrodes are used as the first electrodes 120a and 120b.

In accordance with the embodiment of the present invention, the graphene composite can also be used as the first electrodes 120a and 120b together with the graphene. The graphene composite may be made of a material obtained by mixing the graphene with at least one type material selected from a group consisting of a metal nano wire, a metal nano particle, a carbon nano tube and conductive polymer. There is an advantage that the piezoelectric characteristics of the piezoelectric polymer can be improved by reducing the surface resistance of the graphene by adding the metal nano wire, the metal nanor particle, the carbon nano tube and the conductive polymer or the like into the graphene.

It is preferable that the thicknesses of the first electrodes 120a and 120b are formed within 1 μm.

And also, the second electrodes 130a and 130b can be included on the first electrodes 120a and 120b in order to supplement the electric conductivity of the first electrodes.

In accordance with one embodiment of the present invention, the second electrodes 130a and 130b may be transparent electrodes or opaque electrodes.

The metal to form the second electrodes 130a and 130b may be selected among at least one species powder, nano wires or nano particles selected from a group consisting of Au, Cu, Al and Ag.

In case when the second electrodes 130a and 130b in accordance with the present invention are transparent electrodes, it can be formed in electrodes which are formed in a grid shape with the metal.

And also, in case when the second electrodes 130a and 130b in accordance with the present invention are opaque electrodes, it can be formed by coating the metal on the whole surface.

It is preferable that the thicknesses of the second electrodes 130a and 130b are formed within 1 μm.

In accordance with one embodiment of the present invention, the positions of the first electrodes and the second electrodes can be changed from each other. That is, after the second electrodes 130a and 130b are formed on both surfaces of the piezoelectric polymer 110, it may have a structure that the first electrodes 120a and 120b are formed on both surfaces of the second electrodes 130a and 130b.

Figure 2:
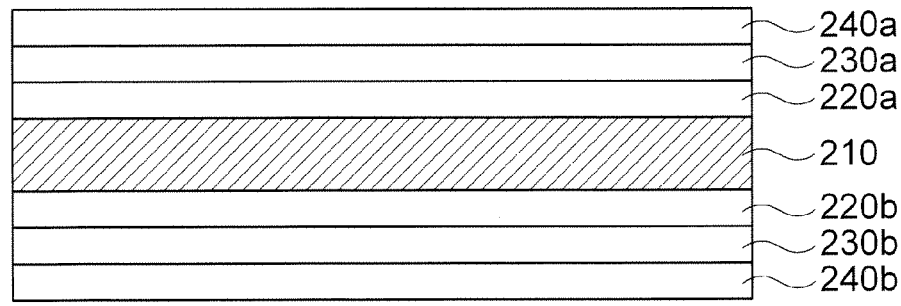

And also, in accordance with another embodiment of the present, the piezoelectric polymer device 200 has a piezoelectric polymer 210 arranged on the center thereof as shown in FIG. 2, it has a multi-layered structure sequentially stacking the first electrodes 220a and 220b, the second electrodes 230a and 230b and the third electrodes 230a and 230b on a single surface or both surfaces of the piezoelectric polymer.

The first electrodes 220a and 220b and the second electrode 230a and 230b may be formed by the same material and method as explained in FIG. 1.

In accordance with one embodiment of the present invention, the positions of the first electrodes and the second electrodes can be changed. That is, after the second electrodes 230a and 230b are formed on both surfaces of the piezoelectric polymer 210, it may have a structure that the first electrodes 220a and 220b are formed on both surfaces of the second electrodes 230a and 230b.

Herein, in addition, the third electrodes 240a and 240b are included, and they prevent the second electrodes from being oxidized and improve the reliability and response characteristics of the piezoelectric device by protecting the second electrodes.

The third electrodes 240a and 240b in accordance with the present invention may use graphene or graphene composites including the same preferably.

In accordance with one embodiment of the present invention, the graphene composite is made of a material obtained by mixing the graphene with at least one type material selected from a group consisting of a metal nano wire, a metal nano particle, a carbon nano tube and conductive polymer.

It is preferable that the thicknesses of the third electrodes 240a and 240b are formed within 1 μm.

The piezoelectric device in accordance with the present invention having the structures as shown in FIGS. 1 and 2 can be preferably used as various sensors such as an ultrasonic sensor, a pressure sensor, a tactile sensor, a strain sensor or an ultrasonic transducer such as a hydro phone or a vibration damper (damper) used for vehicles, buildings or sports instruments such as ski or rackets and vibration generation devices used by being applied to floor, shoes, tires or the like.

Hereinafter, the present invention will be described in detail in accordance with the embodiments of the present invention as follows. The following embodiments merely illustrate the present invention, and it should not be interpreted that the scope of the present invention is limited to the following embodiments. Further, although certain compounds are used in the following embodiments, it is apparent to those skilled in the art that equal or similar effects are shown even when using their equivalents.

Embodiment 1

After the polyvinylidene florodide-trifluoroethylene (PVDF-TrFE) is solved in a methyl ethyl ketone solvent, it is coated on a base film by being casted. The polyvinylidene florodide-trifluoroethylene (PVDF-TrFE) is obtained in a shape of film by evaporating the solvent.

The first electrodes are formed in a thickness of 0.1 μm by forming the graphene composites electrodes (graphene+is a silver nano wire) on both surfaces of the polyvinylidene florodide-trifluoroethylene (PVDF-TrFE) with a slot die coating method.

The second electrodes in the shape of a transparent grid are formed in a thickness of 0.1 μm by forming the silver nano wire electrodes on both surfaces of the first electrodes with the slot die coating method.

The piezoelectric device finally manufactured in accordance with the embodiment 1 makes to have the structure of the following FIG. 1.

Embodiment 2

After the polyvinylidene florodide-trifluoroethylene (PVDF-TrFE) is solved in a methyl ethyl ketone solvent, it is coated on a base film by being casted. The polyvinylidene florodide-trifluoroethylene (PVDF-TrFE) is obtained in a shape of film by evaporating the solvent.

The first electrodes are formed in a thickness of 0.1 µm by forming the graphene composites electrodes (graphene+is a silver nano wire) on both surfaces of the polyvinylidene florodide-trifluoroethylene (PVDF-TrFE) with a slot die coating method.

The second electrodes in the shape of a transparent grid are formed in a thickness of 0.1 µm by forming the silver nano wire electrodes on both surfaces of the first electrodes with the slot die coating method.

The third electrodes are formed in a thickness of 0.1 µm by forming the graphene composites (graphene+conductive polymer) electrodes on both surfaces of the second electrodes with a gravure coating method.

The piezoelectric device finally manufactured in accordance with the embodiment 2 makes to have the structure of the following FIG. 2.

In accordance with the present invention, the vibration response characteristics of the piezoelectric polymer can be improved by using the graphene or the composite thereof as a surface electrode material to the piezoelectric polymer; and, there are effects that the response characteristics of the piezoelectric device are excellent and the reliability thereof is excellent by forming a second electrode having an excellent conductivity and a protection electrode thereof.

What is claimed is:

1. A piezoelectric device with a multi-layered structure, comprising:
   a piezoelectric polymer; and
   a plurality of first electrodes and a plurality of second electrodes stacked sequentially on a single surface or both surfaces of the piezoelectric polymer,
   wherein the first electrodes are graphene having a hexagonal sheet structure or a graphene composite including the same.

2. The piezoelectric device according to claim 1, wherein the piezoelectric polymer is polyvinylidene fluoride (PVDF) and polyvinylidene fluoride-trifluoroethylene (PVDF-TrFE).

3. The piezoelectric device according to claim 1, wherein the graphene composite is made of a material obtained by mixing the graphene with at least one type material selected from a group consisting of a metal nano wire, a metal nano particle, a carbon nano tube and conductive polymer.

4. The piezoelectric device according to claim 1, wherein the second electrodes are transparent electrodes.

5. The piezoelectric device according to claim 1, wherein the second electrodes are opaque electrodes which are obtained by coating metal on a whole surface.

6. The piezoelectric device according to claim 4 or 5, wherein the second electrodes comprise a metal which is at least one of a powder, a nano wire or a nano particle selected from a group consisting of Au, Cu, Al and Ag.

7. The piezoelectric device according to claim 1, further comprising:
   a plurality of third electrodes on the second electrodes.

8. The piezoelectric device according to claim 7, wherein the third electrodes are graphene or graphene composites including the same.

9. The piezoelectric device according to claim 8, wherein the graphene composites are made of materials obtained by mixing the graphene with at least one type material selected from a group consisting of a metal nano wire, a metal nano particle, a carbon nano tube and conductive polymer.

* * * * *